(12) United States Patent
Chien

(10) Patent No.: US 7,213,186 B2
(45) Date of Patent: May 1, 2007

(54) MEMORY BUILT-IN SELF TEST CIRCUIT WITH FULL ERROR MAPPING CAPABILITY

(75) Inventor: Jinn-Yeh Chien, Tao-Yuan (TW)

(73) Assignee: Taiwan Semiconductor Manufacturing Company (TW)

( * ) Notice: Subject to any disclaimer, the term of this patent is extended or adjusted under 35 U.S.C. 154(b) by 475 days.

(21) Appl. No.: 10/755,503

(22) Filed: Jan. 12, 2004

(65) Prior Publication Data

US 2005/0166111 A1    Jul. 28, 2005

(51) Int. Cl.
*G01R 31/28* (2006.01)
*G06F 11/00* (2006.01)
*G11C 29/00* (2006.01)

(52) U.S. Cl. ............... 714/733; 714/718; 714/736; 365/201

(58) Field of Classification Search ............ 714/733, 714/734, 724, 738, 30, 718, 719, 736; 365/201
See application file for complete search history.

(56) References Cited

U.S. PATENT DOCUMENTS

| | | | |
|---|---|---|---|
| 4,835,774 A * | 5/1989 | Ooshima et al. ............ 714/719 |
| 6,019,502 A | 2/2000 | Baeg et al. ................ 371/21.1 |
| 6,367,042 B1 | 4/2002 | Phan et al. ................. 714/733 |
| 6,405,331 B1 | 6/2002 | Chien ....................... 714/718 |
| 6,505,313 B1 | 1/2003 | Phan et al. ................. 714/718 |
| 6,877,118 B2 * | 4/2005 | Oshima et al. ............ 714/719 |
| 2002/0194558 A1 | 12/2002 | Wang et al. ............... 714/718 |
| 2003/0204795 A1 * | 10/2003 | Adams et al. ............. 714/718 |

OTHER PUBLICATIONS

Takeshima et al "A 55-ns 16-Mb DRAM with Built-in Self-Test Functioin Using Microprogram ROM" IEEE Journal of Solid-State Circuits, vol. 25, No. 4, Aug. 1990.*
Franklin et al "Built-in Self-Testing of Random-Access Memories" pp. 45-56, 23(1990) Oct., No. 10, Los Alamitos, CA, US.*

* cited by examiner

*Primary Examiner*—Phung My Chung
(74) *Attorney, Agent, or Firm*—Duane Morris LLP

(57) ABSTRACT

A new built-in self-test circuit device for testing an embedded memory array is achieved. The device comprises a pattern generator unit that executes a testing sequence to automatically write and read locations in an embedded memory. A comparison unit compares data read from the embedded memory and expected data provided by the pattern generator. An error signal is turned ON by the comparison unit when the data read does not match the data provided. An error release unit generates an error stop signal. The error stop signal is turned ON when the error signal is turned ON. The pattern generator unit testing sequence is stopped when the error stop signal is turned ON and is re-started when the error stop signal is turned OFF. The error stop signal is turned OFF when an external device asserts an error release signal.

29 Claims, 5 Drawing Sheets

MEMORY BUILT-IN SELF TEST CIRCUIT WITH FULL ERROR MAPPING CAPABILITY

BACKGROUND OF THE INVENTION (1) Field of the Invention

The invention relates to an integrated circuit device, and, more particularly, to a built-in self test circuit for an embedded memory in an integrated circuit device.

(2) Description of the Prior Art

Embedded memory is an essential building block in many system on chip (SOC) integrated circuit devices. Such devices may combine a central processor function, signal processing, I/O and perhaps both nonvolatile memory and RAM. Of particular importance to the present invention is the presence of a large RAM array embedded in the integrated circuit and the challenges inherent in testing this embedded memory.

Typically, a stand-alone RAM device is tested using an automated, integrated circuit tester. The tester is connected to the I/O pins of the RAM. All of the memory locations within the memory can be easily addressed, written, and read to verify functionality. In this respect, several types of functional test patterns may be used to fully exercise the memory and to detect several types of potential faults. Techniques to detect "stuck at" faults, such as nodes stuck at '0' or stuck at '1' are well known in the art. Further, some patterns are particularly useful for detecting interactions between memory cells where a manufacturing defect causes the write state of a first cell to cause an error in the read state of a second cell. Comprehensive testing and error mapping of the stand-alone memory device is performed using such complex test patterns. The ability to fully access the memory using the available I/O pins allows such testing to be performed in a straightforward manner.

When such a memory array is embedded in a SOC integrated circuit device, the address, data, and control pins of the memory are not typically available to the automated tester. This is particularly true for the final, packaged device. The available pins are assigned to functional uses for the SOC device in its system application. Further, it is typically not practical, from a cost standpoint, to provide the full array of I/O connections from the memory to the tester even at the wafer level test. In addition, it is very difficult to test such a device at the very high operating speed of the circuit. Therefore, it is difficult to perform a comprehensive, automated test on the embedded memory array. Yet, to achieve the high levels of reliability demanded by the customer, it is essential that the memory be fully tested.

To address the above-described problems, methods have been developed in the art to test the embedded memory arrays using circuits built into the SOC device. These circuits are commonly called built-in self test (BIST) circuits or memory BIST (MBIST) circuits. Referring now to FIG. 1, an exemplary integrated circuit device 10 comprising a MBIST circuit 30 is illustrated in block diagram form. The integrated circuit device 10, such as a SOC device, has an embedded memory array 20. This embedded memory 20 may be a RAM array. This memory 20 is written and read by an internal processing unit, not shown, using typical control signals 50 and 52, an address bus 54, and a data bus 56 and 60.

The memory BIST unit 30 is also coupled to the standard control 50 and 52, address 54, and data signals 56 and 60 of the memory. In this way, the MBIST 30 is a second accessing unit to the memory 20. When the device 10 is placed into a self-testing mode by an external, automated tester, the MBIST 30 accesses the memory 20 by controlling the write enable 50, the chip enable 52, address bus 54, and data in/out bus 56 and 60. The MBIST unit 30 comprises a pattern generator unit 38, a compare unit 34, and an optional error address and data storage unit 42. The pattern generator unit 38 executes a testing sequence by writing data to address locations in the embedded memory 20 and then reading these same address locations from the embedded memory 20. The read data from the memory data output 60 is compared to the written data 68 from the pattern generator unit 38 by the compare unit 34. If any of the bits of the data read 60 does not match the value from the pattern generator 38, then the compare unit 34 indicates an error 64 and 62. This error is accessible to the external, automated tester through the ERROR_FLAG output pad 46. If the error address and data storage unit 42 is used, then data in, data out, and address 58 information from the pattern generator unit 38 is stored in the unit 42. The stored version 66 of the address and data information is accessible via an output 66.

This technique can be used to functionally test the memory 20 as indicated by the pass/fail of the ERROR_FLAG. However, there are two serious limitations to this approach. First, the method does not distinguish between single or multiple errors in the memory 20. All fails look the same. Second, the method provides no mapping of where errors or defects are occurring in embedded memory 20. Therefore, while the method facilitates a pass/fail final test, it does not provide visibility into the extent or location of errors for fixing a manufacturing problem.

Several prior art inventions relate to built-in self test (BIST) methods and devices. U.S. Pat. No. 6,019,502 to Baeg et al describes a BIST circuit for testing an embedded function. A circuit provides error detection for the BIST signals. U.S. Pat. No. 6,367,042 B1 to Phan et al discloses a BIST circuit for an embedded memory. The circuit uses a comparitor to compare the expected memory data with the actual memory data. An error signal is generated and is used by a circuit to re-route failed address locations to redundant locations in the memory. U.S. Pat. No. 6,405,331 B1 to Chien teaches a method to perform a BIST on an embedded memory. The method implements a time division multiplex scheme to provide information on detected bad cells through a limited number of output pads to an external automated tester at a reduced clock rate. U.S. Pat. No. 6,505,313 B1 to Phan et al shows a BIST circuit for an embedded memory. U.S. patent application 20020194558 A1 to Wang et al describes a method and a design system for a BIST capable of testing multiple, embedded memories. Capability for diagnosing faulty address and data combinations is also described.

SUMMARY OF THE INVENTION

A principal object of the present invention is to provide an effective and very manufacturable memory built-in self test (MBIST) circuit for testing an embedded memory in an integrated circuit device.

A further object of the present invention is to provide a MBIST having improved performance.

A yet further object of the present invention is to provide a MBIST capable of detecting multiple error bits from an embedded memory.

A yet further object of the present invention is to provide a MBIST capable of providing full mapping of errors in an embedded memory.

A yet further object of the present invention is to provide a MBIST capable of supporting diagnosis of defect patterns in an embedded memory.

A yet further object of the present invention is to provide a method to self test an embedded memory in an integrated circuit device where that method provides improved multiple bit detection and error mapping.

In accordance with the objects of this invention, a built-in self-test circuit device for testing an embedded memory array is achieved. The device comprises a pattern generator unit that executes a testing sequence to automatically write and read locations in an embedded memory. A comparison unit compares data read from the embedded memory and expected data provided by the pattern generator. An error signal is turned ON by the comparison unit when the data read does not match the data provided. An error release unit generates an error stop signal. The error stop signal is turned ON when the error signal is turned ON. The pattern generator unit testing sequence is stopped when the error stop signal is turned ON and is re-started when the error stop signal is turned OFF. The error stop signal is turned OFF when an external device asserts an error release signal.

Also in accordance with the objects of this invention, a method to built-in self-test an embedded memory array is achieved. The method comprises writing and reading locations in an embedded memory by executing a testing sequence in the pattern generator unit. Data read from the embedded memory and expected data provided by the pattern generator unit are compared. An error signal is turned ON when the data read does not match the data provided. An error stop signal is generated. The error stop signal is turned ON when the error signal is turned ON. The writing and reading of locations in an embedded memory by executing a testing sequence in pattern generator unit is stopped when the error stop signal is turned ON and is re-started when the error stop signal is turned OFF. The error stop signal is turned OFF when an external device asserts a release error signal.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a memory built-in self test circuit. A means is achieved for controlling the self test sequence such that command, address, data in, and data out information of failed locations is accessible. It should be clear to those experienced in the art that the present invention can be applied and extended without deviating from the scope of the present invention.

Figure 1:
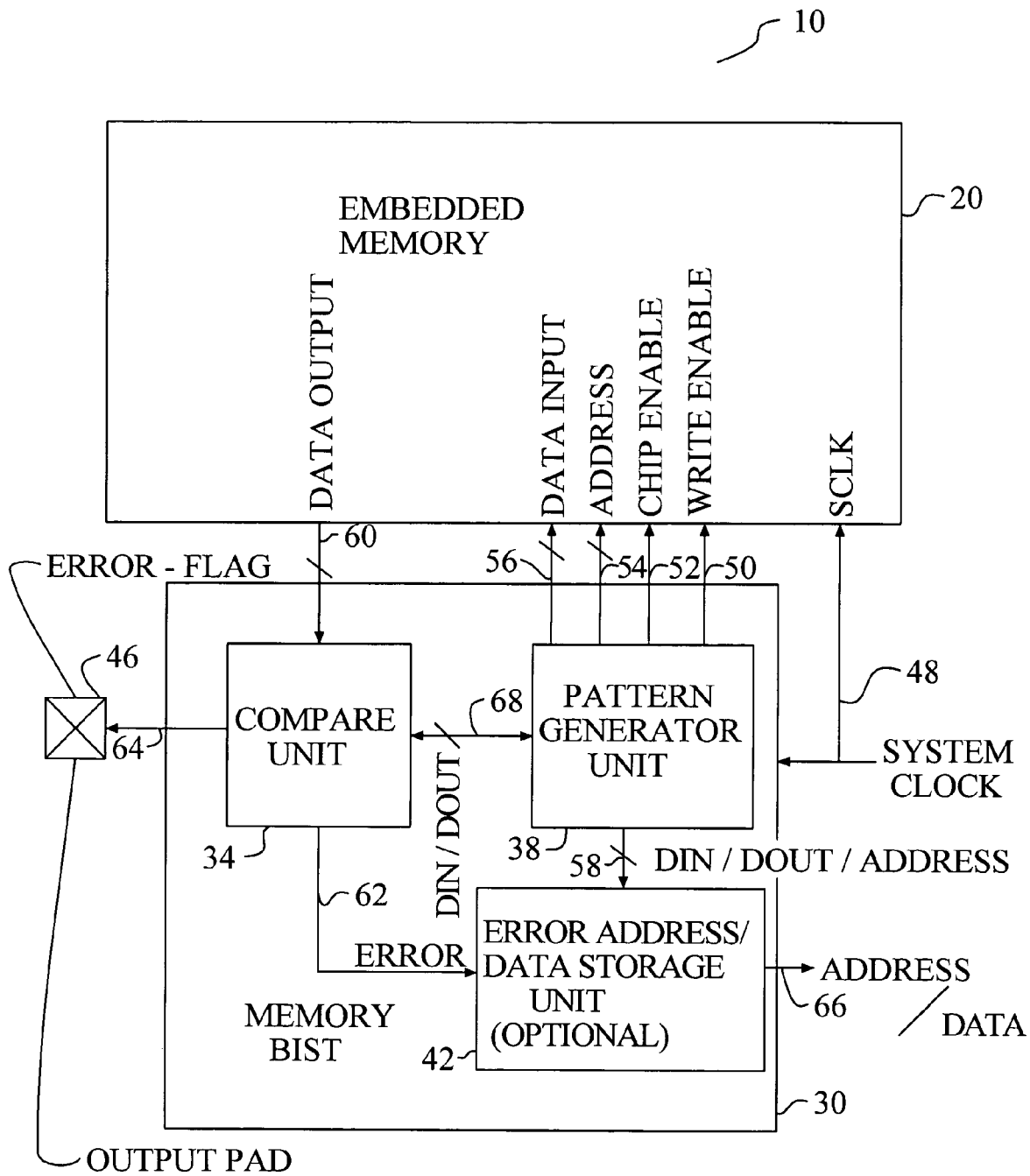
FIG. 1 illustrates a memory built-in self test (MBIST) as typical to the prior art.
Figure 2:
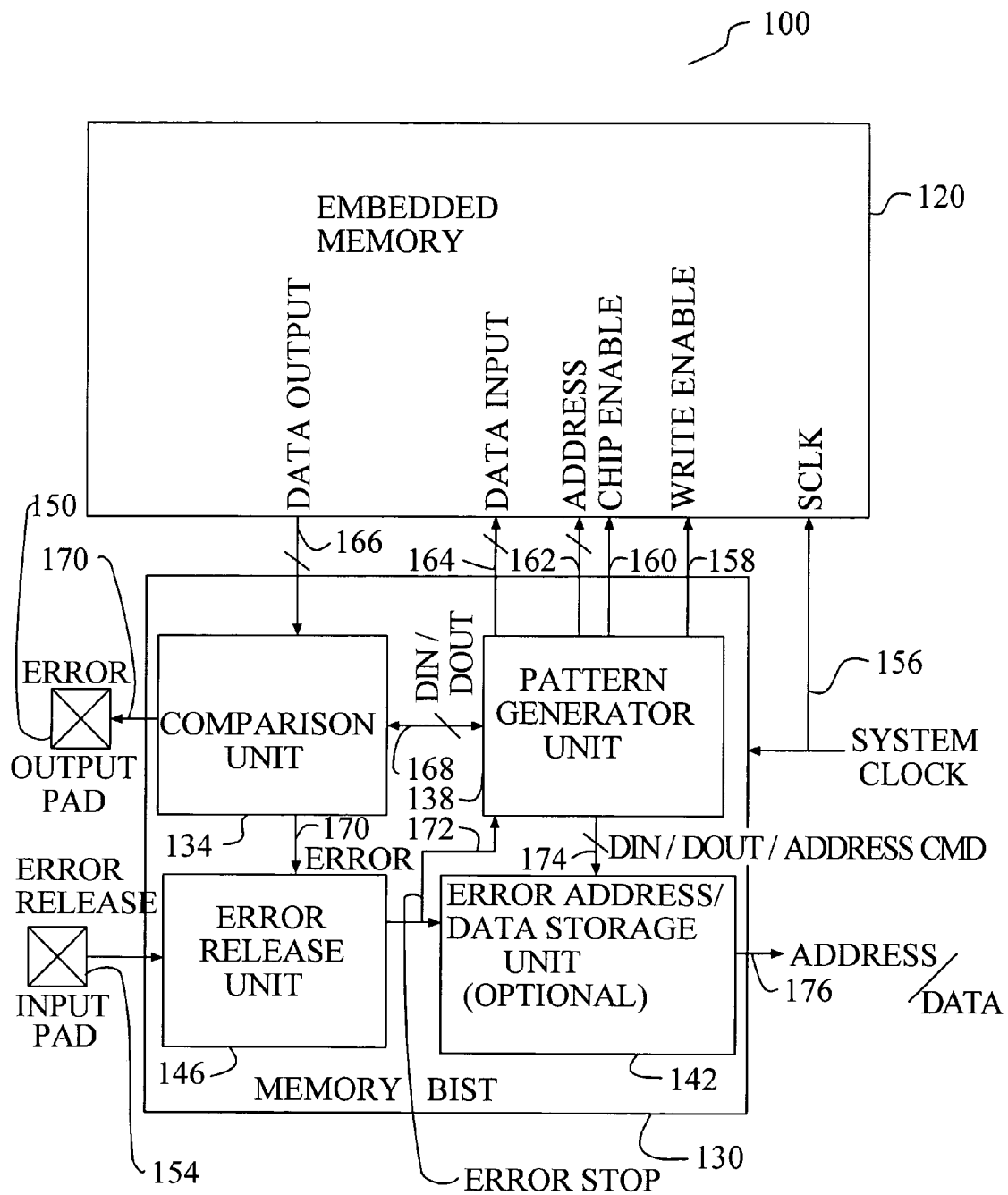
FIG. 2 illustrates a preferred embodiment of a memory built-in self test device (MBIST) of the present invention.

Referring now to FIG. 2, the preferred embodiment of the present invention is illustrated. Several important features of the present invention are shown and discussed below. A novel, built-in self-test circuit device 130 for testing an embedded memory array 120 in an integrated circuit device 100 is achieved. The integrated circuit device 100 preferably comprises a SOC device where a processing unit (CPU) is integrated with other functions such as I/O, data processing, and the embedded memory 120. The embedded memory preferably comprises a RAM array constructed by any of the known techniques. The RAM array 120 may comprise a static RAM (SRAM) or a dynamic RAM (DRAM). The embedded memory unit 120 is accessed using an internal bus. The command signals, such as write enable (WEB) 158 and chip enable (CE) 160, the address bus 162, the data input bus 164, and the data output bus 166, are routed from the processing unit, not shown, to the embedded memory 120. The processing unit can thereby access the embedded memory 120 for writing and reading data.

These same memory control, address, and data signals are also routed to the MBIST unit 130 as shown. The integrated circuit device 100, is configured such that, in a test mode, the MBIST unit 130 takes over control of the memory bus 158–166 from the processing unit. The integrated circuit 100 may be put into this test mode by an external, automated tester.

The MBIST unit, or device, 130 comprises, first, a pattern generator unit 138. The pattern generator unit 138 executes a testing sequence to automatically write and read locations in an embedded memory 120. The testing sequence may comprise any type of memory testing pattern useful for comprehensive testing of such a memory 120 as is well known in the art. The pattern generator 138 controls the memory bus signals 158–164 to write data into the embedded memory 120 according to the design of the testing sequence. For example, a testing sequence may require the writing of a "checkerboard" of '0' and '1' bits to the memory array. This pattern is written into the memory 120 under the control of the pattern generator unit 138. In addition, the pattern generator unit 138 governs the reading of data out from the embedded memory 120. In this case, the command signals, such as chip enable 160 and write enable 158, and the address bus 162 are used to select specific locations in the memory 120. The data is then read out the data output bus 166.

The MBIST unit 130 also comprises a comparison unit 134. The comparison unit 134 compares the data read 166 from the embedded memory 120 and expected data 168 provided by the pattern generator unit 138. In this regard, the pattern generator unit 138 may consecutively write a number of data locations in the embedded memory 120 without performing a data read. Then, the pattern generator unit 138 can command a series of consecutive reads of locations in the memory 120 without any intervening writes. However, anytime data is read from the memory 120 by the pattern generator unit 138, this data is provided to the comparison unit 134. In addition, the pattern generator unit 138 must be configured to provide an expected data pattern to the comparison unit 134 for each data read.

Figure 3:
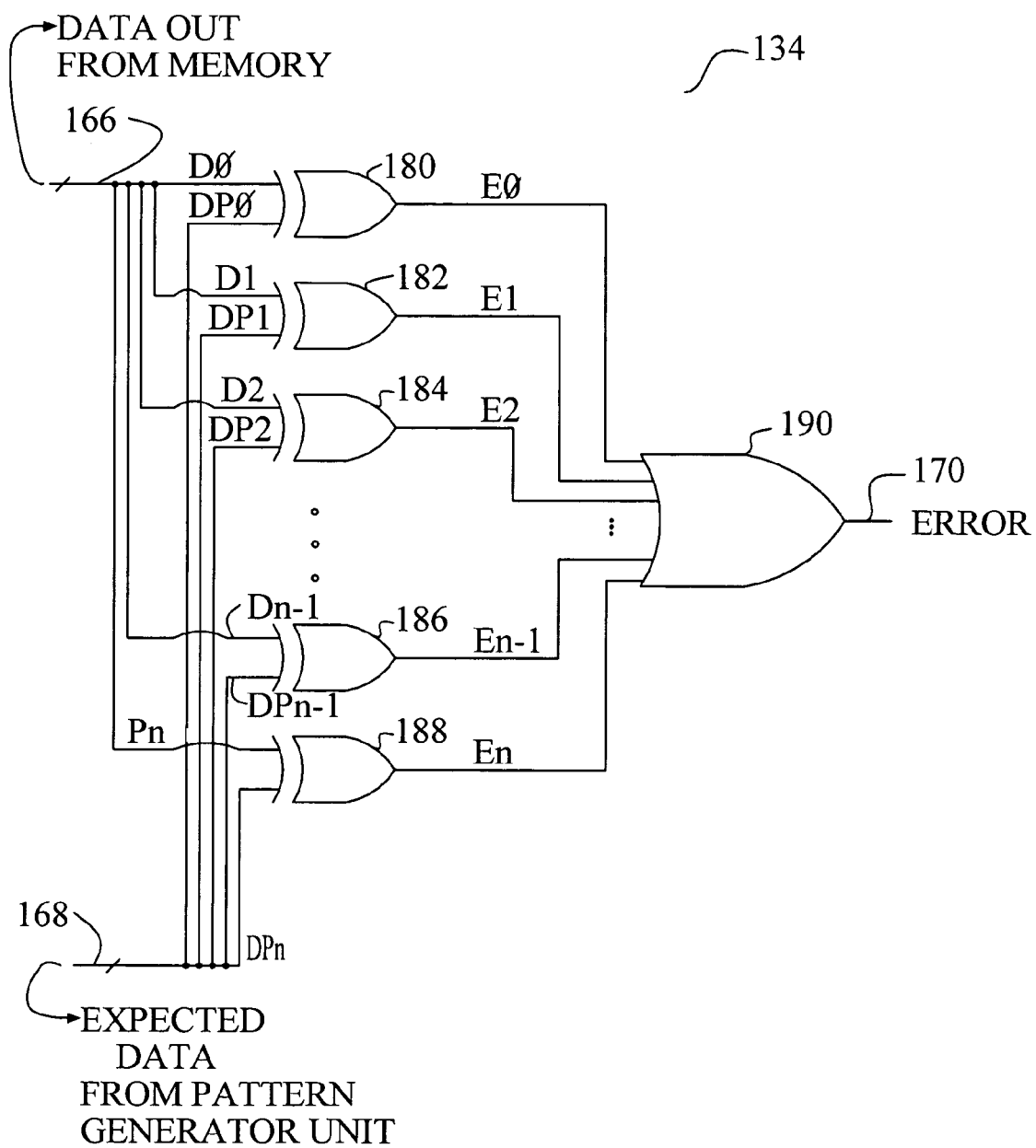
FIG. 3 illustrates a preferred embodiment of a comparison unit of the present invention.

Referring now to FIG. 3, the preferred embodiment of the comparison unit 134 is illustrated. The comparison unit 134 has the function of first comparing each bit of data (D0–Dn) read 166 from memory with each bit of data (DP0–DPn) provided 168 by the pattern generator unit. This bit-by-bit comparison is done using an exclusive OR (XOR) function as shown by gates 180, 182, 184, 186, and 188. The outputs (E0–En) of the bit-by-bit XOR gates are high anytime the data read 166 from memory does not match the data provided 168 by the pattern generator. These outputs E0–En, in turn, become inputs to an OR function 190. In this way, any single bit error or combination of bit errors will result in the turning ON of the ERROR signal 170.

Referring again to FIG. 2, as an important feature of the present invention, the MBIST unit 130 has an error release unit 146. The error release unit generates an error stop signal (ERROR STOP) 172. The ERROR STOP signal is used to control the operation of the pattern generator circuit 138 and the error address and data storage unit 142 as will be further explained below.

Figure 4:
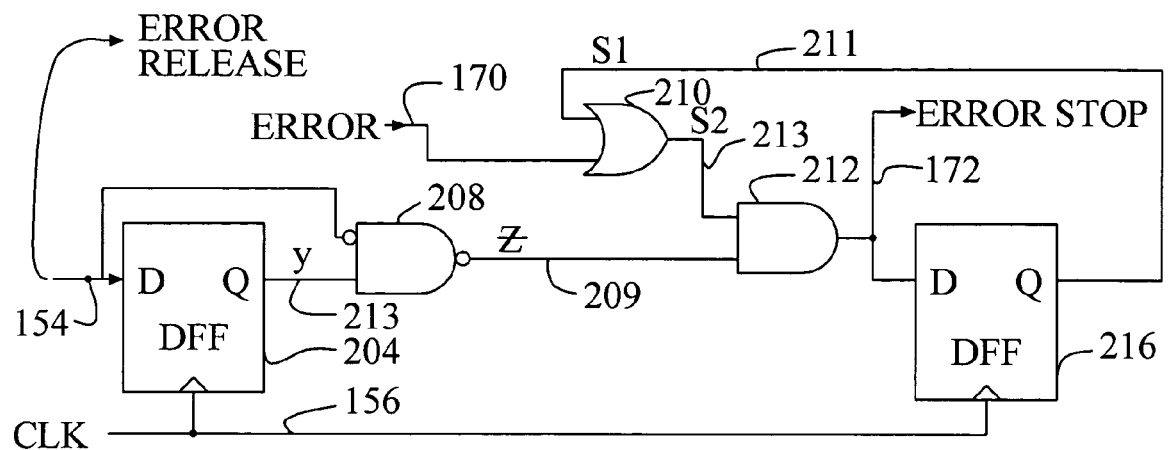
FIG. 4 illustrates a preferred embodiment of an error release control unit of the present invention.
Figure 4:
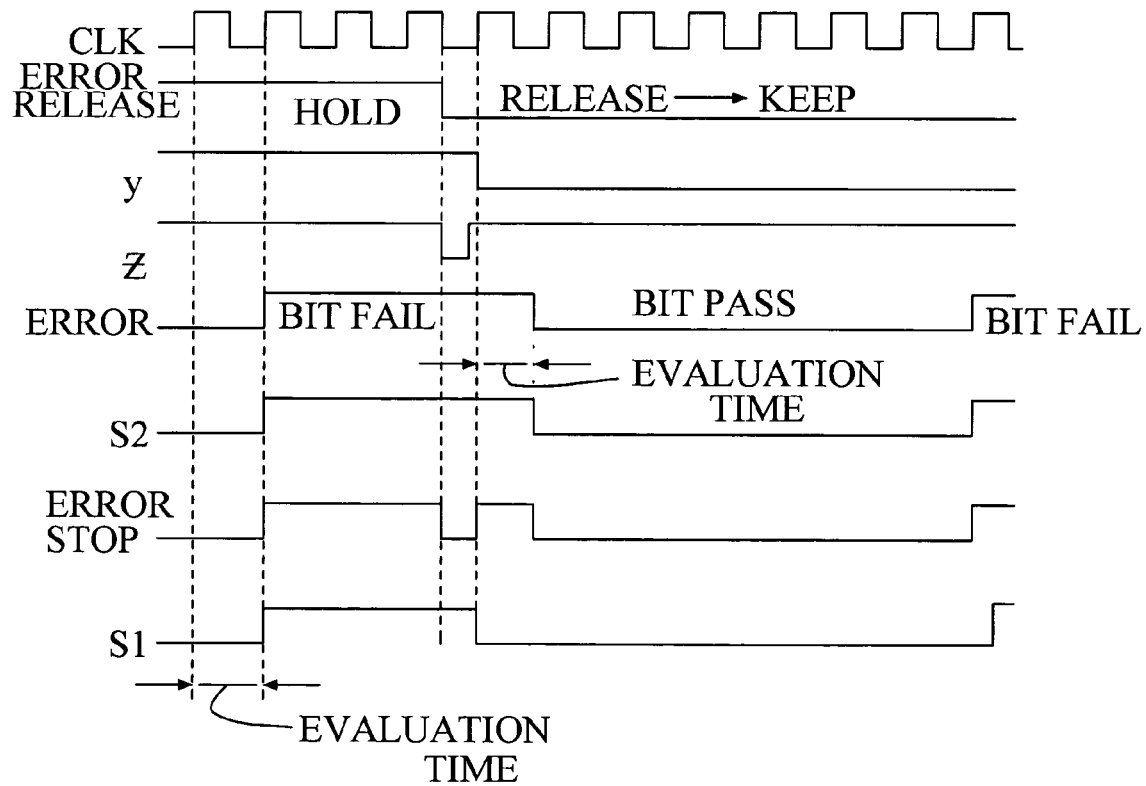

Referring now to FIG. 4, the novel error release unit 146 is illustrated in detail. The error release unit 146 has three key inputs and one output. The inputs are the ERROR signal 170 that is generated by the comparison unit 134 as described above. The ERROR RELEASE input 154 is provided from a source external to the integrated circuit device, such as an external, automatic tester. Referring again to FIG. 2, the ERROR RELEASE signal 154 is connected to an input pad 154. During the memory testing time, the automated tester, not shown, holds the ERROR RELEASE signal 154 in the high state. If an error is detected by the MBIST unit 130, this causes the ERROR signal 170 to turn ON. The error release unit 146 then turns ON the ERROR STOP signal 172. The ON state of the ERROR STOP signal 172 causes the pattern generator unit 138 to stop execution of the testing sequence. The testing sequence will be held OFF until an external intervention by the tester (or other external device) to toggle the ERROR RELEASE signal 154 to the low state. In addition, the optional error address and data storage unit 142 switches to a holding state such that the current memory data bus, address bus, and command signals are held and are available on the ADDRESS/DATA bus 176.

Referring again to FIG. 4, the ERROR RELEASE signal 154 is connected to the D input of the first flip flop 204 and to the inverting input of the NAND gate 208. The Q output of the first flip flop 204 is connected to the non-inverting input of the NAND gate 208 as the signal Y 213. When ERROR RELEASE 154 is ON or high, the output Z 209 of the NAND gate 208 is high. If an error is then detected by the comparison unit, then the ERROR signal 170 is turned ON or high to indicate a BIT FAIL. As a result, the output S2 213 of the OR gate 210 is forced HIGH. Since the Z output 209 of NAND gate 208 is already high, the ERROR STOP output 172 of NAND gate 212 is forced high. Finally, when the second DFF 216 clocks this new D-state (ERROR STOP), the Q output S1 211 latches the ERROR STOP state as high or ON. As noted above, when ERROR STOP 172 turns ON, the pattern generator unit is stopped and the optional error address and data storage unit is switched to the holding state. At this point, the tester can read and store the address location, the data read value, and the command values of the embedded memory 120 at the time of the error detection. As a key feature, this opportunity to read and store the memory state at the point of error detection provides a key diagnostic capability. Further, since the pattern generator unit 138 is stopped, no part of the memory test is missed during this step. Rather, the next test is merely delayed.

Once the external tester device has performed any read and/or storage of memory data, the tester can toggle the ERROR RELEASE signal 154 to a low state to RELEASE the testing circuit to continue the test. The combination of the first flip flop DFF 204 and the NAND gate 208 creates a "one-shot", low pulse on the Z signal 209 in response to the toggle of the ERROR RELEASE signal 154. This results in a one shot, low pulse on the ERROR STOP signal 172. The second DFF then latches the new S1 state with the ERROR STOP 172 forced low or OFF. As an important feature, it should be noted that the MBIST unit 130 and the embedded memory 120 are operationally synchronized by a common, system clock 156 as shown in FIG. 2. However, it cannot be assumed that the ERROR RELEASE input 154 and the SYSTEM CLOCK 156 are synchronized since the ERROR RELEASE input 154 is driven from an external source. Referring again to FIG. 4, the "one-shot" function described creates a synchronized version of Z 209 of the ERROR RELEASE 154 signal. The low pulse of Z 209 resets the ERROR STOP signal 172 to the OFF state. The OFF state of ERROR STOP 172 re-starts the pattern generate unit 138 so that the memory testing sequence is continued. If another error is detected by the comparison unit 134, the sequence is repeated. In this way, the circuit can detect and provide diagnostic data on continuous bit errors.

Figure 5:
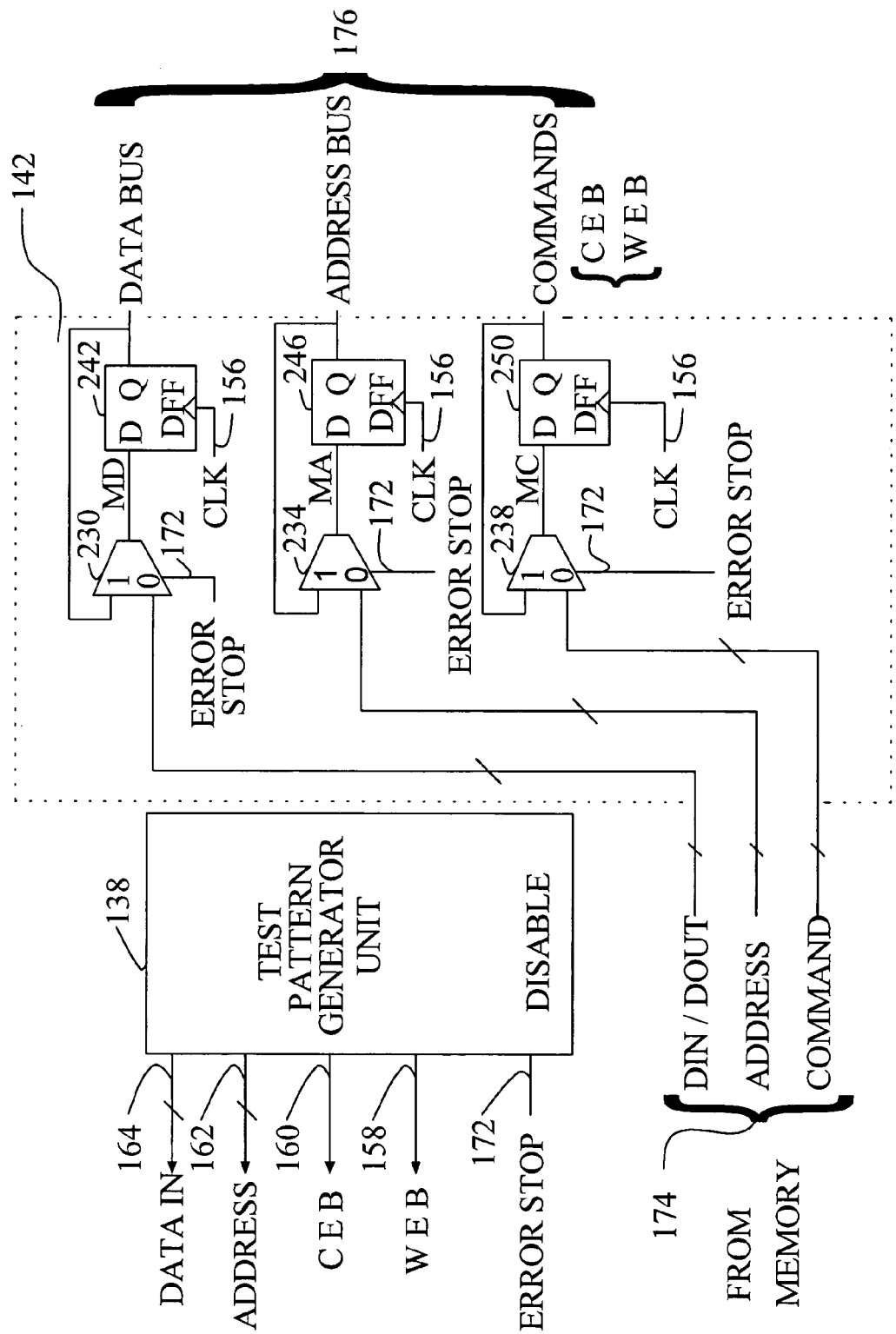
FIG. 5 illustrates an error address and data storage unit of the present invention.

Referring now to FIG. 5, the optional error address and data storage unit 142 is illustrated in more detail. This unit 142 provides a capability of storing the address bus, data bus, and command signal data 174 from the embedded memory 120 at the time of an error detection. The error address and data storage unit 142 comprises a plurality of storage cells, such as flip flops 242, 246, and 250. Note that each of these flip flops is actually multiple bits wide to accommodate the size of the particular bus (data, address, command) attached to it. A plurality of multiple bit wide multiplex units 230, 234, and 238 are used to select between the memory bus data 174 and the stored states (Q) of the flip flops 242, 246, and 250. The multiplex units are controlled by the state of the ERROR STOP signal 172. When the MBIST is in the "no error" state, the ERROR STOP signal 172 is OFF and the flip flops 242, 246, and 250 are continuously updated with the current memory bus states 174. However, when an error is detected, the ERROR STOP signal is ON and the last memory bus state 174 is held in the flip flops 242, 246, and 250, and cannot be written over. This allows the external tester device to retrieve the key address, data, and command parameters 176 from the integrated circuit device 100. Further, this information can be retrieved as slow speed and/or through a serial output because the MBIST test is held at a stopped state. When the data has been retrieved by the tester, the ERROR RELEASE signal 154 is toggled by the tester to cause the ERROR STOP signal 172 to turn OFF. This process is repeated for each read error detected by the comparison unit 134 such that continuously occurring errors can all be detected without data loss. In this way, the error pattern of the entire memory 120 can be mapped.

The advantages of the present invention may now be summarized. An effective and very manufacturable memory built-in self test (MBIST) circuit for testing an embedded memory in an integrated circuit device is achieved. The MBIST has improved performance and is capable of detecting multiple error bits from an embedded memory. The MBIST is capable of providing full mapping of errors in an embedded memory. The MBIST is capable of supporting diagnosis of defect patterns in an embedded memory. A method to self test an embedded memory in an integrated circuit device where that method provides improved multiple bit detection and error mapping is achieved.

As shown in the preferred embodiments, the novel device and method of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A built-in self-test circuit device for testing an embedded memory array, said device comprising:
   a pattern generator unit that executes a testing sequence to automatically write and read locations in an embedded memory;
   a comparison unit that compares data read from said embedded memory and expected data; provided by said pattern generator unit wherein an error signal is turned ON by said comparison unit when said data read does not match said data provided;
   and an error release unit that generates an error stop signal wherein said error stop signal is turned ON when said error signal is turned ON, wherein said pattern generator unit testing sequence is stopped when said error stop signal is turned ON and is re-started when said error stop signal is turned OFF, and wherein said error stop signal is turned OFF when an external device asserts an error release signal.

2. The device according to claim 1 wherein said built-in self-test circuit device and said embedded memory are synchronized by a clock signal.

3. The device according to claim 2 wherein said error release unit comprises a means to synchronize said release error signal and said clock signal.

4. The device according to claim 3 wherein said error release unit further comprises:
   a first flip-flop having an input terminal connected to said error release signal and having a clock terminal connected to said clock signal;
   and a second flip flop having an input terminal connected to said error stop signal and having a clock terminal connected to said clock signal.

5. The device according to claim 1 further comprising an error address and data storage unit that stores address and command signals from said pattern generator unit and that stores current data signals from said embedded memory whenever said error stop signal is turned ON.

6. The device according to claim 5 wherein said error address and data storage unit comprises:
   a plurality of flip flops each having an output terminal coupled to one of a plurality of testing pads; and
   a plurality of multiplex units each having an output terminal coupled to one input of said flip flops wherein said multiplex units select a control, an address, or a data signal from said embedded memory or select said output terminal of said flip flop to which said multiplex circuit is coupled based on said error stop signal.

7. The device according to claim 1 wherein said comparison unit comprises:
   a plurality of XOR gates each having a first input terminal coupled to a data signal from said embedded memory and each having a second input terminal coupled to an expected data signal from said pattern generator unit; and
   an OR gate having a plurality of input terminals each coupled to an output terminal of one of said XOR gates and having an output terminal that determines said error signal.

8. A built-in self-test circuit device for testing an embedded memory array, said device comprising:
   a pattern generator unit that executes a testing sequence to automatically write and read locations in an embedded memory;
   a comparison unit that compares data read from said embedded memory and expected data provided by said pattern generator unit wherein an error signal is turned ON by said comparison unit when said data read does not match said data provided; and
   an error release unit that generates an error stop signal wherein said error stop signal is turned ON when said error signal is turned ON, wherein said pattern generator unit testing sequence is stopped when said error stop signal is turned ON and is re-started when said error stop signal is turned OFF, wherein said error stop signal is turned OFF when an external device asserts an error release signal, wherein said built-in self-test circuit device and said embedded memory are synchronized by a clock signal, and wherein said error release unit comprises a means to synchronize said release error signal and said clock signal.

9. The device according to claim 8 wherein said error release unit further comprises:
   a first flip-flop having an input terminal connected to said error release signal and having a clock terminal connected to said clock signal; and
   a second flip flop having an input terminal connected to said error stop signal and having a clock terminal connected to said clock signal.

10. The device according to claim 8 further comprising an error address and data storage unit that stores address and command signals from said pattern generator unit and that stores current data signals from said embedded memory whenever said error stop signal is turned ON.

11. The device according to claim 10 wherein said error address and data storage unit comprises:
   a plurality of flip flops each having an output terminal coupled to one of a plurality of testing pads; and
   a plurality of multiplex units each having an output terminal coupled to one input of said flip flops wherein said multiplex units select a control, an address, or a data signal from said embedded memory or select said output terminal of said flip flop to which said multiplex circuit is coupled based on said error stop signal.

12. The device according to claim 8 wherein said comparison unit comprises:
   a plurality of XOR gates each having a first input terminal coupled to a data signal from said embedded memory and each having a second input terminal coupled to an expected data signal from said pattern generator unit; and
   an OR gate having a plurality of input terminals each coupled to an output terminal of one of said XOR gates and having an output terminal that determines said error signal.

13. A method to built-in self-test an embedded memory array, said method comprising: writing and reading locations in an embedded memory by executing a testing sequence in pattern generator unit;
   comparing data read from said embedded memory and expected data provided by said pattern generator unit wherein an error signal is turned ON when said data read does not match said data provided; and
   generating an error stop signal wherein said error stop signal is turned ON when said error signal is turned ON, wherein said writing and reading of locations in an embedded memory by executing a testing sequence in pattern generator unit is stopped when said error stop signal is turned ON and is re-started when said error stop signal is turned OFF, and wherein said error stop signal is turned OFF when an external device asserts a release error signal.

14. The method according to claim 13 wherein said pattern generator unit and said embedded memory are synchronized by a clock signal.

15. The method according to claim 14 wherein said step of generating an error stop signal is by an error release unit comprises a means to synchronize said release error signal and said clock signal.

16. The method according to claim 15 wherein said error release unit further comprises:
   a first flip-flop having an input terminal connected to said error release signal and having a clock terminal connected to said clock signal; and
   a second flip flop having an input terminal connected to said error stop signal and having a clock terminal connected to said clock signal.

17. The method according to claim 13 further comprising storing address and command signals from said pattern generator unit and storing current data signals from said embedded memory whenever said error stop signal is turned ON.

18. The method according to claim 17 wherein said step of storing address and command signals from said pattern generator unit and storing current data signals from said embedded memory is by an address and data storage unit further comprising:
   a plurality of flip flops each having an output terminal coupled to one of a plurality of testing pads; and
   a plurality of multiplex units each having an output terminal coupled to one input of said flip flops wherein said multiplex units select a control, an address, or a data signal from said embedded memory or select said output terminal of said flip flop to which said multiplex circuit is coupled based on said error stop signal.

19. The method according to claim 13 wherein said step of comparing data read from said embedded memory and expected data provided by said pattern generator unit is by a comparison unit comprising:
   a plurality of XOR gates each having a first input terminal coupled to a data signal from said embedded memory and each having a second input terminal coupled to an expected data signal from said pattern generator unit; and
   an OR gate having a plurality of input terminals each coupled to an output terminal of one of said XOR gates and having an output terminal that determines said error signal.

20. The method according to claim 13 wherein said external device comprises a automated tester.

21. A built-in self-test circuit device for testing an embedded memory array, said device comprising:
   a pattern generator unit that executes a testing sequence to automatically write and read locations in an embedded memory;
   a comparison unit that compares data read from said embedded memory and expected data; provided by said pattern generator unit wherein an error signal is turned ON by said comparison unit when said data read does not match said data provided; and
   an error release unit that generates an error stop signal wherein said error stop signal is turned ON when said error signal is turned ON, wherein said pattern generator unit testing sequence is stopped when said error stop signal is turned ON and is re-started when said error stop signal is turned OFF, and wherein said error stop signal is turned OFF when an external device asserts an error release signal; said built-in self-test circuit device and said embedded memory are synchronized by a clock signal and said error release unit includes a means to synchronize said release error signal and said clock signal;
   said error release unit further comprises a first flip-flop having an input terminal connected to said error release signal and having a clock terminal connected to said clock signal, and a second flip flop having an input terminal connected to said error stop signal and having a clock terminal connected to said clock signal.

22. A built-in self-test circuit device for testing an embedded memory array, said device comprising:
   a pattern generator unit that executes a testing sequence to automatically write and read locations in an embedded memory;
   a comparison unit that compares data read from said embedded memory and expected data; provided by said pattern generator unit wherein an error signal is turned ON by said comparison unit when said data read does not match said data provided; and
   an error release unit that generates an error stop signal wherein said error stop signal is turned ON when said error signal is turned ON, wherein said pattern generator unit testing sequence is stopped when said error stop signal is turned ON and is re-started when said error stop signal is turned OFF, and wherein said error stop signal is turned OFF when an external device asserts an error release signal;
   an error address and data storage unit that stores address and command signals from said pattern generator unit and that stores current data signals from said embedded memory whenever said error stop signal is turned ON, said error address and data storage unit further including:
   a plurality of flip flops each having an output terminal coupled to one of a plurality of testing pads; and a plurality of multiplex units each having an output terminal coupled to one input of said flip flops wherein said multiplex units select a control, an address, or a data signal from said embedded memory or select said output terminal of said flip flop to which said multiplex circuit is coupled based on said error stop signal.

23. A built-in self-test circuit device for testing an embedded memory array, said device comprising:
   a pattern generator unit that executes a testing sequence to automatically write and read locations in an embedded memory;
   a comparison unit that compares data read from said embedded memory and expected data provided by said pattern generator unit wherein an error signal is turned ON by said comparison unit when said data read does not match said data provided; and
   an error release unit that generates an error stop signal wherein said error stop signal is turned ON when said error signal is turned ON, wherein said pattern generator unit testing sequence is stopped when said error stop signal is turned ON and is re-started when said error stop signal is turned OFF, wherein said error stop signal is turned OFF when an external device asserts an error release signal, wherein said built-in self-test circuit device and said embedded memory are synchronized by a clock signal, and wherein said error release unit comprises a means to synchronize said release error signal and said clock signal;
   wherein said error release unit further includes: a first flip-flop having an input terminal connected to said error release signal and having a clock terminal connected to said clock signal; and a second flip flop having an input terminal connected to said error stop signal and having a clock terminal connected to said clock signal.

24. A built-in self-test circuit device for testing an embedded memory array, said device comprising:
   a pattern generator unit that executes a testing sequence to automatically write and read locations in an embedded memory;
   a comparison unit that compares data read from said embedded memory and expected data provided by said pattern generator unit wherein an error signal is turned ON by said comparison unit when said data read does not match said data provided;
   an error release unit that generates an error stop signal wherein said error stop signal is turned ON when said error signal is turned ON, wherein said pattern generator unit testing sequence is stopped when said error stop signal is turned ON and is re-started when said error stop signal is turned OFF, wherein said error stop signal is turned OFF when an external device asserts an error release signal, wherein said built-in self-test circuit device and said embedded memory are synchronized by a clock signal, and wherein said error release unit comprises a means to synchronize said release error signal and said clock signal; and
   an error address and data storage unit that stores address and command signals from said pattern generator unit and stores current data signals from said embedded memory whenever said error stop signal is turned ON, the error address and data storage unit having:
   a plurality of flip flops each having an output terminal coupled to one of a plurality of testing pads; and a plurality of multiplex units each having an output terminal coupled to one input of said flip flops wherein said multiplex units select a control, an address, or a data signal from said embedded memory or select said output terminal of said flip flop to which said multiplex circuit is coupled based on said error stop signal.

25. A method to built-in self-test an embedded memory array, said method comprising:
   writing and reading locations in an embedded memory by executing a testing sequence in pattern generator unit;
   comparing data read from said embedded memory and expected data provided by said pattern generator unit wherein an error signal is turned ON when said data read does not match said data provided;
   generating an error stop signal wherein said error stop signal is turned ON when said error signal is turned ON, wherein said writing and reading of locations in an embedded memory by executing a testing sequence in pattern generator unit is stopped when said error stop signal is turned ON and is re-started when said error stop signal is turned OFF, and wherein said error stop signal is turned OFF when an external device asserts a release error signal; and
   synchronizing said pattern generator unit and said embedded memory with a clock signal;
   wherein said step of generating an error stop signal is by an error release unit having a means to synchronize said release error signal and said clock signal, a first flip-flop having an input terminal connected to said error release signal and having a clock terminal connected to said clock signal, and a second flip flop having an input terminal connected to said error stop signal and having a clock terminal connected to said clock signal.

26. A method to built-in self-test an embedded memory array, said method comprising:
   writing and reading locations in an embedded memory by executing a testing sequence in pattern generator unit;
   comparing data read from said embedded memory and expected data provided by said pattern generator unit wherein an error signal is turned ON when said data read does not match said data provided; and
   generating an error stop signal wherein said error stop signal is turned ON when said error signal is turned ON, wherein said writing and reading of locations in an embedded memory by executing a testing sequence in pattern generator unit is stopped when said error stop signal is turned ON and is re-started when said error stop signal is turned OFF, and wherein said error stop signal is turned OFF when an external device asserts a release error signal; and
   storing address and command signals from said pattern generator unit and storing current data signals from said embedded memory whenever said error stop signal is turned ON;
   wherein said step of storing address and command signals from said pattern generator unit and storing current data signals from said embedded memory is by an address and data storage unit further including: a plurality of flip flops each having an output terminal coupled to one of a plurality of testing pads; and a plurality of multiplex units each having an output terminal coupled to one input of said flip flops wherein said multiplex units select a control, an address, or a data signal from said embedded memory or select said output terminal of said flip flop to which said multiplex circuit is coupled based on said error stop signal.

27. A built-in self-test circuit device for testing an embedded memory array, said device comprising:
   a pattern generator unit that executes a testing sequence to automatically write and read locations in an embedded memory;
   a comparison unit that compares data read from said embedded memory and expected data; provided by said pattern generator unit wherein an error signal is turned ON by said comparison unit when said data read does not match said data provided;
   an error release unit that generates an error stop signal wherein said error stop signal is turned ON when said error signal is turned ON, wherein said pattern generator unit testing sequence is stopped when said error stop signal is turned ON and is re-started when said error stop signal is turned OFF, and wherein said error stop signal is turned OFF when an external device asserts an error release signal; and
   an error address and data storage unit for storing address, command and current data signals from whenever said error stop signal is turned ON; said error address and data storage unit having at least one flip flop receiving an input from a multiplex unit, said multiplex unit selecting an input from a control, an address, or a data signal.

28. The built-in self-test device of claim 27, wherein depending on said error stop signal, the multiplex unit further selects an output terminal of said flip flop to which said multiplex circuit is coupled.

29. A built-in self-test circuit device for testing an embedded memory array, said device comprising:
   a pattern generator unit that executes a testing sequence to automatically write and read locations in an embedded memory;

a comparison unit that compares data read from said embedded memory and expected data; provided by said pattern generator unit wherein an error signal is turned ON by said comparison unit when said data read does not match said data provided;

an error release unit that generates an error stop signal wherein said error stop signal is turned ON when said error signal is turned ON, wherein said pattern generator unit testing sequence is stopped when said error stop signal is turned ON and is re-started when said error stop signal is turned OFF, and wherein said error stop signal is turned OFF when an external device asserts an error release signal;

wherein said built-in self-test circuit device and said embedded memory are synchronized by a clock signal; and wherein said error release unit synchronizes the release error signal and the clock signal; and wherein said error release unit includes a plurality of flip flops for generating the error stop signal.

* * * * *